US012696558B2

(12) United States Patent
Fowler et al.

(10) Patent No.: US 12,696,558 B2
(45) Date of Patent: Jul. 28, 2026

(54) COLOR ROUTER BASED PHOTODIODES AND INTEGRATED PIXEL CIRCUIT

(71) Applicant: OMNIVISION TECHNOLOGIES, INC., Santa Clara, CA (US)

(72) Inventors: Boyd Fowler, Sunnyvale, CA (US); Kenny Geng, Mountain View, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 450 days.

(21) Appl. No.: 18/347,017

(22) Filed: Jul. 5, 2023

(65) Prior Publication Data

US 2025/0015101 A1     Jan. 9, 2025

(51) Int. Cl.
*H10F 39/00*         (2025.01)
(52) U.S. Cl.
CPC ... *H10F 39/8023* (2025.01); *H10F 39/80373* (2025.01); *H10F 39/8053* (2025.01); *H10F 39/813* (2025.01)
(58) Field of Classification Search
CPC ............. H10F 39/8023; H10F 39/8053; H10F 39/813; H04N 25/78
See application file for complete search history.

(56) References Cited

U.S. PATENT DOCUMENTS 8,089,036 B2     1/2012 Manabe
2024/0397230 A1 *  11/2024 Kim ..................... H04N 25/771

OTHER PUBLICATIONS

Zhao, N. et al., "Perfect RGB-IR Color Routers for Sub-Wavelength Size CMOS Image Sensor Pixels", Advanced Photonics Research, 2021, 10 pages.

* cited by examiner

*Primary Examiner* — Thanh Luu
(74) *Attorney, Agent, or Firm* — CHRISTENSEN O'CONNOR JOHNSON KINDNESS PLLC

(57)         ABSTRACT

Color router based photodiodes and integrated pixel circuit. In one embodiment, a plurality of pixels arranged in rows and columns of a pixel array are disposed in a semiconductor material. In some embodiments, each pixel comprises a plurality of photodiodes and a color router covering the plurality of photodiodes. In some embodiments, the plurality of pixels is configured to receive an incoming light through the color router. In some embodiments, the integrated pixel circuit includes a plurality of pixel circuits, where each pixel circuit is associated with a corresponding pixel of the plurality of pixels. In some embodiments, the pixel circuits are configured on a same horizontal plane as the plurality of photodiodes.

22 Claims, 11 Drawing Sheets

COLOR ROUTER BASED PHOTODIODES AND INTEGRATED PIXEL CIRCUIT

BACKGROUND INFORMATION

Field of the Disclosure

This disclosure relates generally to the design of image sensors, and in particular, relates to image sensors having improved illumination of photodiodes.

Background

Image sensors have become ubiquitous. They are widely used in digital still cameras, cellular phones, security cameras, as well as medical, automotive, and other applications. The technology for manufacturing image sensors continues to advance at a great pace. For example, the demands for higher image sensor resolution and lower power consumption motivate further miniaturization and integration of image sensors into digital devices.

Image sensor operates in response to image light coming from an external scene and being incident upon the image sensor. An image sensor includes an array of pixels having photosensitive elements (e.g., photodiodes) that absorb a portion of the incident image light and in response generate corresponding electrical charge. The electrical charge of individual pixels may be measured as an output voltage of each photosensitive element. In general, the output voltage varies as a function of the intensity and duration of the incident light. The output voltage of individual photosensitive elements is used to produce a digital image (i.e., image data) representing an external scene.

In some applications, photodiodes are illuminated by the incoming light through a combination of lens and color filter, thus exposing individual photodiodes to a given color (wavelength) of light, for example, blue, green, or red. Based on the photodiodes being exposed to only limited wavelength range, the properties of the photodiodes can be optimized, such that, for example, a peak sensitivity of given photodiode is within the target range of light wavelengths. However, the lenses and color filters necessarily attenuate the incoming light, therefore limiting dynamic range of the photodiodes. Therefore, systems and methods are needed for improved illumination and dynamic range of the image sensors.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
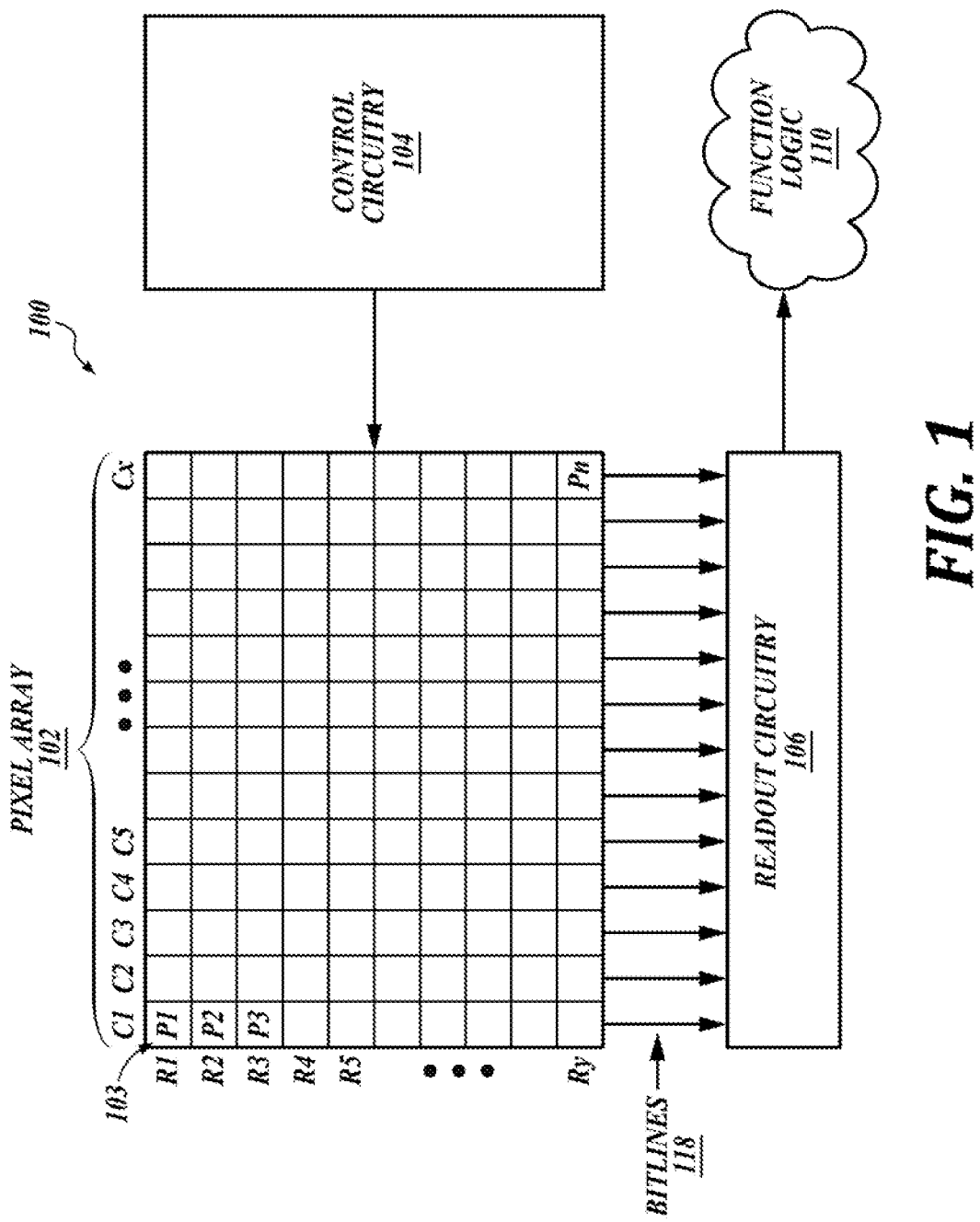
FIG. 1 illustrates an imaging system according to an embodiment of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Image sensors, and in particular, image sensors that include color routers are disclosed. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

From the foregoing, it will be appreciated that specific embodiments of the technology have been described herein for purposes of illustration, but that various modifications may be made without deviating from the disclosure. Moreover, while various advantages and features associated with certain embodiments have been described above in the context of those embodiments, other embodiments may also exhibit such advantages and/or features, and not all embodiments need necessarily exhibit such advantages and/or features to fall within the scope of the technology. Where methods are described, the methods may include more, fewer, or other steps. Additionally, steps may be performed in any suitable order. Accordingly, the disclosure can encompass other embodiments not expressly shown or described herein. In the context of this disclosure, the terms "about," "approximately," etc., mean +/−5% of the stated value.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Briefly, the embodiments of the present technology are directed to photodiodes that are coupled with color routers. In some embodiments, a color router is used in place of microlenses and color filters. The color router may cover a plurality of photodiodes in a pixel or pixel group. Furthermore, disclosed herein are architectures for pixels and pixel groups that allow for pixel circuitry to be on a same horizontal plane as a plurality of photodiodes in each pixel or pixel group. In some embodiments, each pixel includes four quadrants, where three of the four quadrants include a photodiode, and the fourth quadrant includes pixel circuitry associated with the pixel. In some embodiments, four pixels are arranged in a pixel group, so that the fourth quadrant of each pixel is aligned to form a connected pixel area. In some embodiments, this connected pixel area includes connected pixel circuitry, that is, the shared circuitry for every photodiode in the pixel group (for example, a lateral overflow integration capacitor (LOFIC)).

FIG. 1 illustrates an example imaging system 100 in accordance with an embodiment of the present disclosure. The imaging system 100 includes a pixel array 102, a control circuitry 104, a readout circuitry 106 (also referred to as a pixel circuitry) and a function logic 110. In one example, the pixel array 102 is a two-dimensional (2D) array of photodiodes or image sensor pixels 112 (e.g., pixels P1, P2 . . . , Pn). As illustrated, the photodiodes are arranged into rows (e.g., rows R1 to Ry) and columns (e.g., column C1 to Cx). In operation, the photodiodes acquire image data of an outside scene, which can then be used to render a 2D image of the person, place, object, etc. However, in other embodiments the photodiodes may be arranged into configurations other than rows and columns.

In an embodiment, after each pixel 112 in the pixel array 102 acquires its image charge, the image data is read out by the readout circuitry 106 via bitlines 118, and then transferred to a function logic 110. In various embodiments, the readout circuitry 106 may include signal amplifiers, analog-to-digital (ADC) conversion circuitry and data transmission circuitry. The function logic 110 may store the image data or even manipulate the image data by applying post image effects (e.g., crop, rotate, remove red eye, adjust brightness, adjust contrast, or otherwise). In some embodiments, the control circuitry 104 and function logic 110 may be combined into a single functional block to control the capture of images by the pixels 112 and the readout of image data from the readout circuitry 106. The function logic 110 may be a digital processor, for example. In one embodiment, the readout circuitry 106 may read one row of image data at a time along readout column lines (bitlines 118) or may read the image data using a variety of other techniques, such as a serial readout or a full parallel readout of all pixels simultaneously (not illustrated).

In one embodiment, the control circuitry 104 is coupled to the pixel array 102 to control operation of the plurality of photodiodes in the pixel array 102. For example, the control circuitry 104 may generate a shutter signal for controlling image acquisition. In one embodiment, the shutter signal is a global shutter signal for simultaneously enabling all pixels within the pixel array 102 to simultaneously capture their respective image data during a single data acquisition window. In another embodiment, the shutter signal is a rolling shutter signal such that each row, column, or group of pixels is sequentially enabled during consecutive acquisition windows. In another embodiment, image acquisition is synchronized with lighting effects such as a flash.

In one embodiment, readout circuitry 106 includes analog-to-digital converters (ADCs), which convert analog image data received from the pixel array 102 into a digital representation. The digital representation of the image data may be provided to the function logic 110. In some embodiments, the data transmission circuitry 108 may receive the digital representations of the image data from the ADCs in parallel and may provide the image data to the function logic 110 in series.

In different embodiments, imaging system 100 may be included into a digital camera, cell phone, laptop computer, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2:
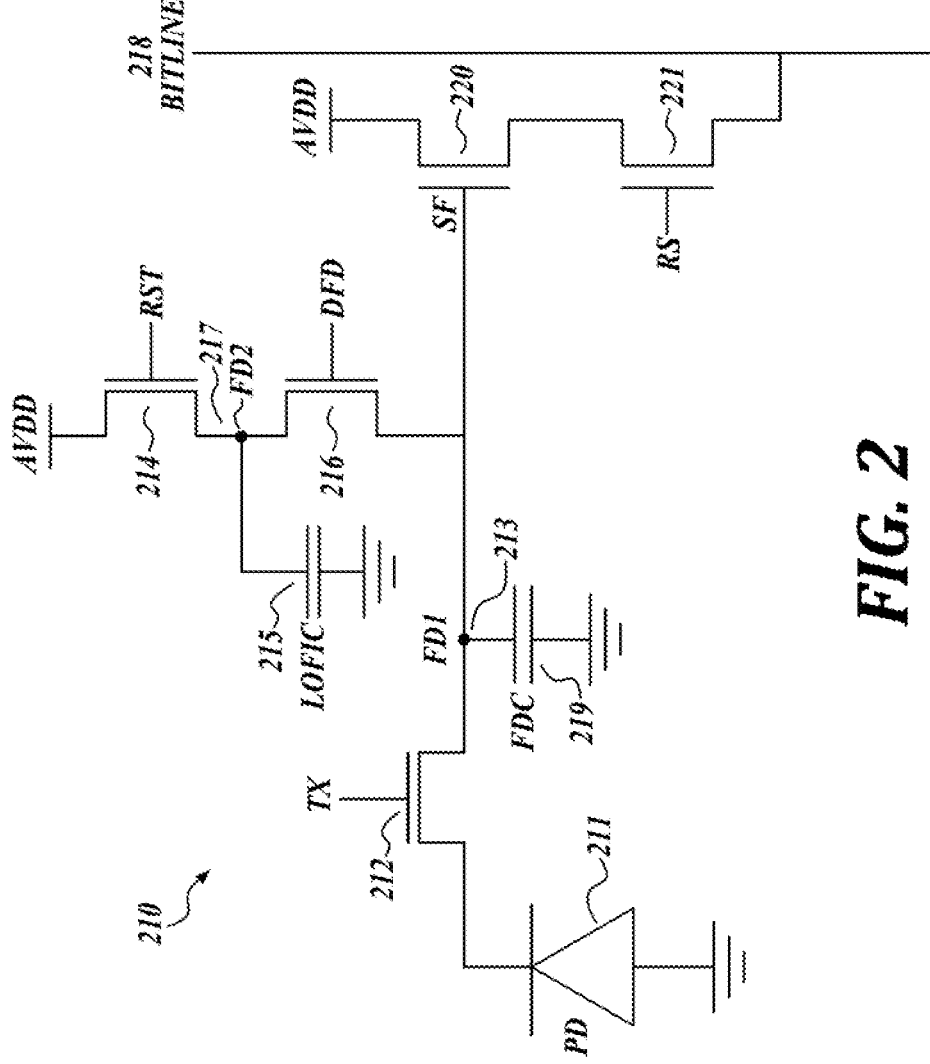
FIG. 2 is an illustrative schematic of a conventional pixel circuit in accordance with the present disclosure.

FIG. 2 is an illustrative schematic of a conventional pixel 210 in accordance with the present disclosure. The pixel 210 may be coupled to a bitline 218, e.g., a readout column that provides image data to readout circuitry, such as the readout circuitry 106. In operation, the pixel 210 may receive control signals from control circuitry, such as the control circuitry 104, to control the operation of the various transistors of the pixel 210. The control circuitry may control the operation of the transistors in desired sequences with relative timing that assures an ordered read out of the image data.

The illustrated embodiment of the pixel 210 includes a photodiode (PD) 211, a floating diffusion (FD1) 213 having an intrinsic capacitor (FDC) 219, a transfer transistor 212, an optional dual floating diffusion (DFD) transistor 216, an optional floating diffusion (FD2) 217 connected to an optional lateral overflow integration capacitor (LOFIC) 215, a reset (RST) transistor 214, a row select (RS) transistor 221, and a source follower (SF) transistor 220. The transfer (TX) transistor 212, which may also be referred to as a transfer gate 212, is coupled between the photodiode PD 211 and the floating diffusion FD1 213. The TX transistor 212 operates based on a TX control signal on its gate terminal. While the floating diffusion FD1 213 is depicted as connected to an intrinsic capacitor FDC 219 that is connected to ground, the combination of FD1 213 and FDC 219 may also be collectively referred to as a floating diffusion.

The RST transistor 214 may be coupled to a reference voltage AVDD and may receive a reset control signal on its gate terminal. The additional capacitance LOFIC 215 may be coupled between a variable reference voltage VCAP and floating diffusion node FD2 217. The DFD transistor 216 may be coupled between FD1 213 and FD2 217, and further coupled to receive a DFD control signal on its gate terminal. Further, a gate terminal of the SF transistor 220 is coupled to floating diffusion node FD1 213. The source/drain terminals of the SF transistor are coupled between the reference voltage AVDD and the RS transistor. The RS transistor 221 may be coupled between the bitline 218 and the SF transistor 220.

In operation, the transistor TX 212 receives gate signal to enable charge transfer from the PD 211 to the floating diffusion FD1 213. In general, the amount of charge transfer depends on the light exposure of the PD 211 and operation of the pixel 210. The equivalent capacitor FDC 219 is illustrated as coupled to ground.

In some embodiments, LOFIC 215 may increase the storage, e.g., capacitance, of the floating diffusion FD2 217. For example, in response to high intensity illumination, the photodiode PD 211 may generate more charge than the floating diffusion FD1 213 can store. The extra charge may be stored by the LOFIC 215. In some embodiments, a reference voltage VCAP may modulate between two or more voltage levels (e.g., high voltage level "H" and low voltage level "L"), thus regulating how much charge is stored by the LOFIC 215. In general, the FDC 219 has a smaller capacitance than the LOFIC 215. Therefore, the floating diffusion FD1 213 is read in conjunction with the high conversion gain (HCG) part of the data readout, while the floating diffusion FD2 217 and floating diffusion 213 are read out in conjunction with the low conversion gain (LCG) part of the readout. Collectively, HCG and LCG readouts constitute a dual conversion gain (DCG) data readout.

In some embodiments, operation of the RST transistor 214 and the DFD transistor 216 may reset the floating diffusion FD1 213 to a high voltage that represents a dark state, because photogenerated electrons, when transferred to the floating diffusion FD1 213, decrease the voltage proportionally to the intensity of the PD 211 charge. To reset the floating diffusion FD1 213, both the RST transistor 214 and the DFD transistor 216 are enabled (ON) by their respective gate signals. In other embodiments, the RST transistor 214 may be in an ON state, while the DFD transistor remains in an OFF state, hence resetting the floating diffusion FD2 217, but not resetting the floating diffusion FD1 213.

The variable voltage VCAP coupled to the LOFIC 215 may be modulated between two or more voltage levels during an integration. In some embodiments, VCAP may be modulated between around 0.4V to around 1.8V, depending on the value of AVDD. In other embodiments, other voltage levels may be implemented depending on the underlying semiconductor materials. The coupling of the FD2 217 to the FD1 213 when the DFD 216 is enabled may provide additional capacitance to store the charge generated by the PD 211. For example, when the TX 212 is enabled to transfer image charge to the floating diffusion FD1 213, the DFD 216 may be enabled to couple the additional capacitance LOFIC 215 to the floating diffusion FD1 213 to increase the full well capacity (FWC) of the floating diffusion. In some embodiments, the variable voltage VCAP may be at different voltages depending on whether the TX transistor 212 is enabled or disabled.

Figure 3:
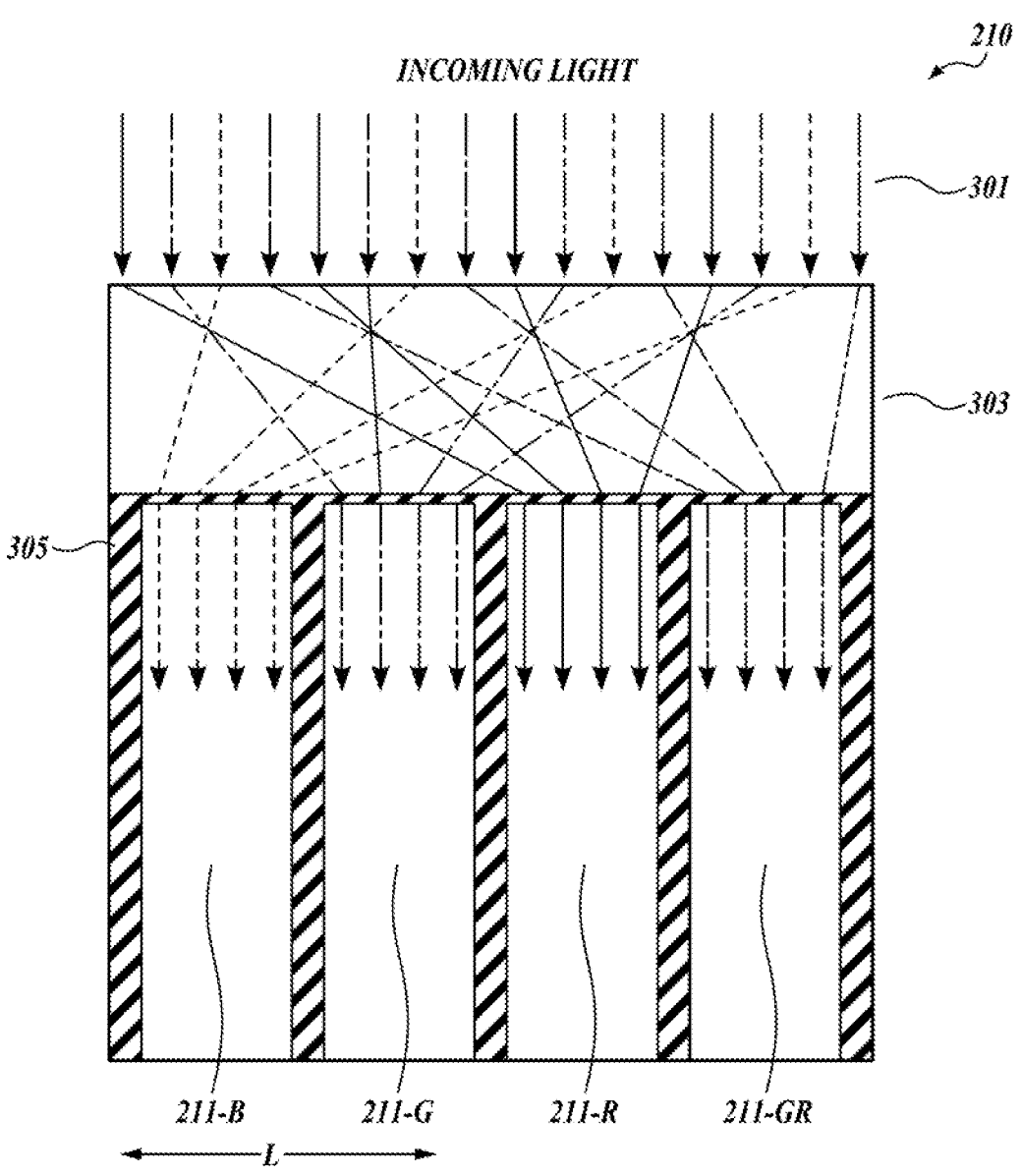
FIG. 3 is a side view of a pixel having color router in accordance with an embodiment of the present disclosure.

FIG. 3 is a side view of a pixel 210 having a color router 303 in accordance with an embodiment of the present disclosure. The pixel 210 may include a plurality of photodiodes 211-B, 211-G, 211-R, and 211-GR formed in a semiconductor substrate 305. The color router 303 may cover the plurality of photodiodes 211-B, 211-G, 211-R, and 211-GR so that this plurality of photodiodes receive an incoming light 301 through the color router 303. L represents a characteristic length. In some embodiments, the characteristic length L is one wavelength of the incoming light.

The plurality of photodiodes 211-B, 211-G, 211-R, and 211-GR may be a blue photodiode 211-B, a green photodiode 211-G, a red photodiode 211-R, and a gray photodiode 211-GR. In some embodiments, the plurality of photodiodes 211-B, 211-G, 211-R, and 211-GR are configured to receive incoming light 301 through the color router 303 as described herein. In some embodiments, each photodiode of the plurality of photodiodes 211-B, 211-G, 211-R, and 211-GR is configured to receive incoming light 301 of a specific color, such as blue light, green light, red light, and gray light, respectively.

In some embodiments, the plurality of photodiodes 211-B, 211-G, 211-R, and 211-GR are formed in semiconductor substrate 305. In some embodiments, the silicon wafer 305 is a semiconductor substrate formed from silicon, silicon germanium, silicon germanium alloy, germanium, a silicon carbide alloy, an indium gallium arsenide alloy, any other alloys formed of III-V compounds, other semiconductor materials or alloys, combinations thereof, a substrate thereof, a bulk substrate thereof, or a wafer thereof. While four photodiodes 211-B, 211-G, 211-R, and 211-GR are illustrated in the semiconductor substrate 305, it should be understood that different number of photodiodes may be formed or embedded in the silicon wafer 305.

In some embodiments, the color router 303 comprises one or more high refractive materials, such as TiO2, embedded in a low refractive index medium. In some embodiments, the color router 303 includes one or more nano posts made of the high refractive material embedded in the low refractive index medium. In some embodiments, the one or more nano posts have different dimensions (i.e., diameters) that selectively slow incoming light 301 as it reaches the plurality of photodiodes 211-B, 211-G, 211-R, and 211-GR.

In operation, incoming light 301 travels through the nano-posts much slower than the incoming light 301 that passes through the low refractive index medium and the surrounding area. The induced phase difference of the incoming light 301 rises and falls as a function of wavelength $\lambda$, thus allowing for wavelength-dependent spatial separation. In some embodiments, this wavelength-dependent spatial separation is caused by constructive and/or destructive interference and diffraction phenomena as the incoming light passes through the nano posts. The amount of phase retardation at red, green, and blue representative wavelengths may be determined by the dimension-sensitive effective refractive index of the nano posts (i.e., based on the nano posts respective diameters and spatial distribution of the nano posts). Based on the acquired phase dispersion information, it is possible to design a condition that simultaneously satisfies the desired phase distribution for each wavelength under various conditions. In this manner, the color router 303 can separate incoming light 301 into red light, green light, and blue light simultaneously, and direct this separated light into each respective photodiode of the plurality of photodiodes 211-B, 211-G, 211-R, and 211-GR as shown in FIG. 3. Accordingly, the color router 303 may allow for greater efficiencies in the photodiodes 211-R, 211-G, 211-B, 211-GR in comparison to a conventional combination of color filter and microlens. By utilizing color router 303, a microlens and/or color filter may be omitted from the image sensor, thus avoiding the light intensity loss caused by the color filter.

Figure 4:
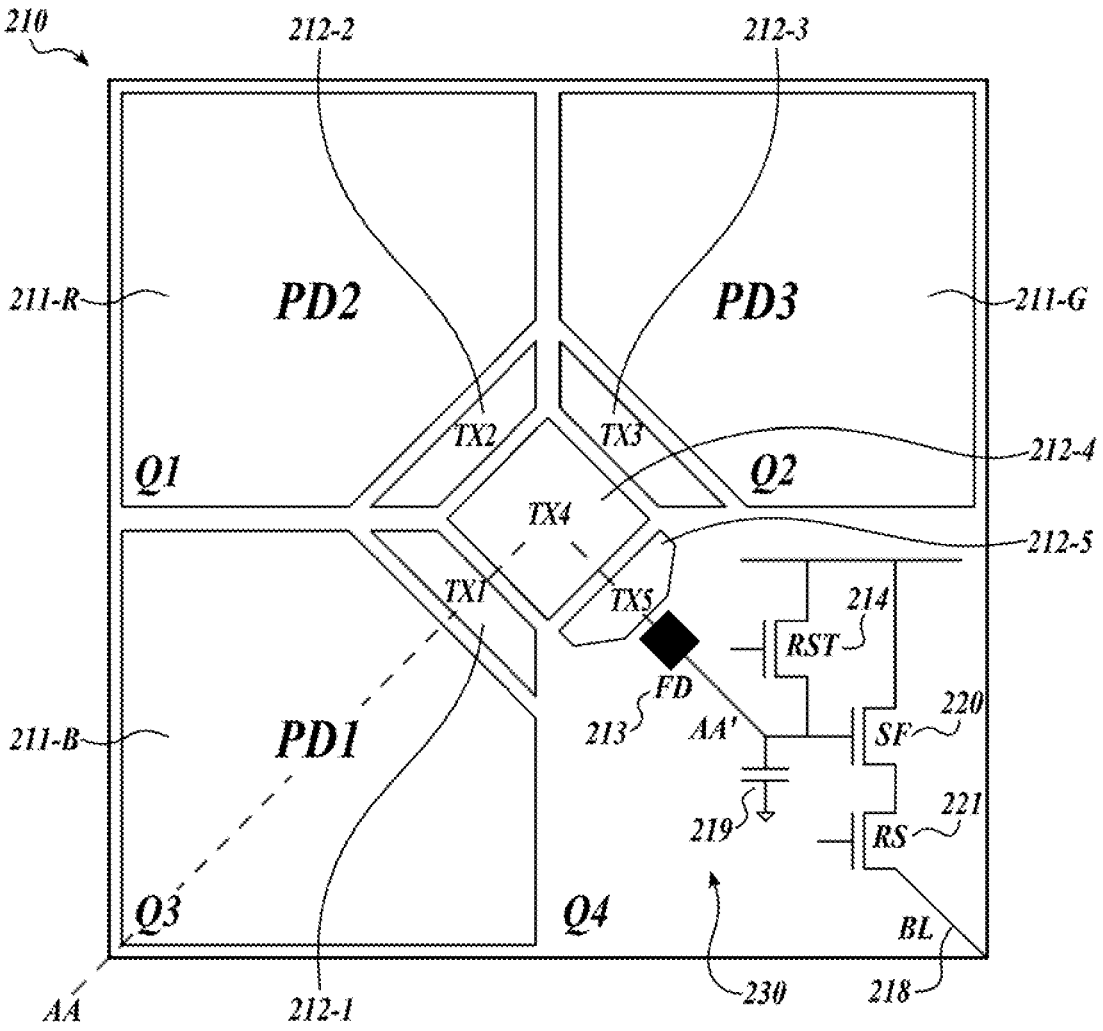
FIG. 4 is a top view of photodiodes and pixel circuit in accordance with embodiments of the present disclosure.

FIG. 4 is a top view of a pixel 210 including a plurality of photodiodes 211-B, 211-R, 211-G and a pixel circuit 230 in accordance with embodiments of the present disclosure. In some embodiments, the pixel 210 includes four quadrants Q1, Q2, Q3, and Q4. In some embodiments, the pixel 210 includes a group of photodiodes 211-R, 211-G, 211-B. Each photodiode of the group of photodiodes 211-R, 211-G, 211-B is located in the first quadrant Q1, the second quadrant Q2, and the third quadrant Q3, respectively. In some embodiments, the pixel 210 includes only a single red photodiode 211-R, a single green photodiode 211-G, and a single blue photodiode 211-B. It should be understood that while the red photodiode 211-R is located in the first quadrant Q1, the green photodiode 211-G is located in the second quadrant Q2, and the blue photodiode 211-B is located in the third quadrant Q3 in FIG. 4, each photodiode of the group of photodiodes 211-R, 211-G, 211-B may be located in any quadrant Q1, Q2, and Q3. In some embodiments, the group of photodiodes 211-R, 211-G, 211-B may be the photodiodes 211-R, 211-G, 211-B shown in FIG. 3. In some embodiments, a color router (such as color router 303) may cover the photodiodes 211-R, 211-G, 211-B (not shown in FIG. 4). Because the color router allows for the omission of color filters and microlenses, the pixel circuitry 230 may be located on a same horizontal plane (e.g., the plane of paper in FIG. 4) as the photodiodes 211-R, 211-G, 211-B. This is in contrast with the layout of conventional photodiodes and pixel circuit where the photodiodes are distributed in one plane (closer to the color filters and microlenses) and the pixel circuits are distributed in another plane (further away from the filters and microlenses). In the conventional art, the plane of the photodiodes is configured between the plane of the pixel circuits on one side and the plane of the color filters and microlenses on the other side. Additionally, because the color router increases the efficiency of the group of photodiodes 211-R, 211-G, 211-B, only a single red photodiode 211-R, green photodiode 211-G, and blue photodiode 211-B may be included in the pixel 210, thus generating an available space for a placement of the readout circuit (pixel circuit), as further explained below.

In some embodiments, the pixel 210 includes a central transfer transistor (TX4) 212-4. The central transistor (TX4) 212-4 is located in the center (region) enclosed by the four quadrants Q1, Q2, Q3, Q4 on the same horizontal plane of the semiconductor substrate. In some embodiments, each photodiode of the group of photodiodes 211-R, 211-G, 211-B includes a respective transfer transistor (TX1) 212-1, (TX2) 212-2, (TX3) 212-3. In some embodiments, the central transfer transistor TX4 212-4 is adjacent to each transfer transistor TX1 212-1, TX2 212-2, TX3 212-3 of the first quadrant Q1, the second quadrant Q2, and the third quadrant Q3. In operation, each transfer transistor TX1 212-1, TX2 212-2, TX3 212-3 is enabled to transfer image charge from their respective photodiode 211-R, 211-G, 211-B to the central transfer transistor TX4 212-4, as described in detail in FIG. 6.

In some embodiments, pixel circuit 230 includes a floating diffusion (FD) 213 with an intrinsic capacitor (FDC) 219, coupled to a reset transistor (RST) 214, a source follower (SF) transistor 220, a row select (RS) transistor 221, and a bitline BL (218), as described herein. In some embodiments, pixel circuit 230 further includes a subsequent transfer transistor (TX5) 212-5 coupled to the floating diffusion FD 213. In operation, the central transistor TX4 212-4 receives gate signals to enable charge transfer from each photodiode 211-R, 211-G, 211-B to the subsequent transfer transistor TX5 212-5. In general, the amount of charge transfer depends on the light exposure of each of the photodiodes 211-R, 211-G, 211-B and the operation of the pixel 210. The subsequent transfer transistor TX5 212-5 receives the charge from the central transistor TX4 212-4. In some embodiments, the pixel circuit (readout circuit) 230 allows for a readout from one photodiode of the group of photodiodes 212-R, 212-G, 212-B as shown and described in detail in FIG. 5. In some embodiments, the pixel circuit 230 is configured to generate simultaneous readouts from the group of photodiodes 212-R, 212-B, 212-G to generate a black and white image. Dashed line AA to AA' represents a cross section of a flow path of charge from photodiode 211-B to the floating diffusion FD 213. This cross section is shown and further described with respect to FIG. 6.

Figure 5:
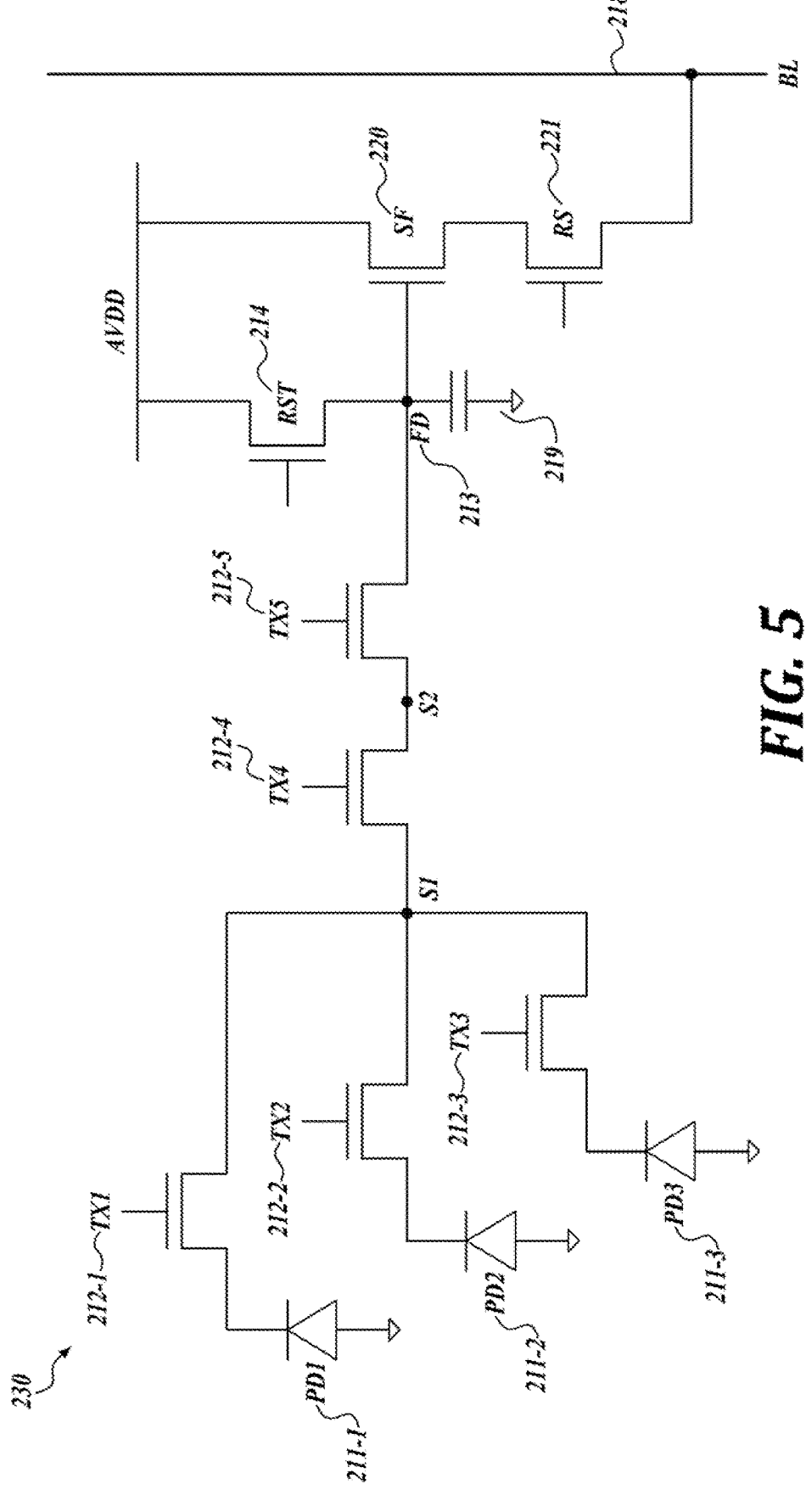
FIG. 5 is an illustrative schematic of a pixel circuit in accordance with an embodiment of the present disclosure.

FIG. 5 is an illustrative schematic of a pixel circuit 230 in accordance with an embodiment of the present disclosure. Pixel circuit 230 is one possible architecture of pixel circuitry for implementing each pixel (such as pixel 210 in FIG. 4) within pixel array 103 of FIG. 1. Pixel circuit 230 can be implemented either with front-side or with back-side illuminated pixel arrays.

The illustrated embodiment of pixel circuit 230 includes a first photodiode (PD1) 211-1, a second photodiode (PD2) 211-2, and a third photodiode (PD3) 211-3. The photodiodes 211-1, 211-2 and 211-3 may correspond to the blue photodiode 211-B, red photodiode 211-R and green photodiode 211-G shown in FIG. 4. In some embodiments, the first photodiode PD1 211-1, the second photodiode PD2 211-2, and the third photodiode PD3 211-3 are coupled to a respective transfer transistor (TX1 212-1, TX2 212-2, TX3 212-3). Specifically, the first photodiode PD1 211-1 is coupled to a first transfer transistor TX1 212-1, the second photodiode PD2 211-2 is coupled to a second transfer transistor TX2 212-2, and the third photodiode PD3 is coupled to a third transfer transistor TX3 212-3. In one embodiment, the transfer transistors TX1 212-1, TX2 212-2, TX3 212-3 are sized similarly, which reduces the space required for the readout circuit and increases the fill factor (defined as a ratio of an area occupied by different components of the readout circuit versus a total available area in the fourth quadrant Q4). In some embodiments, each of the transfer transistors TX1 212-1, TX2 212-2, TX3 212-3 is coupled to a central transfer transistor TX4 212-4. In some embodiments, the central transfer transistor TX4 212-4 is coupled to a subsequent transfer transistor TX5 212-5, which is coupled to a floating diffusion FD 213. Node S2 is configured between the central transfer transistor TX4 212-4 and the subsequent transfer transistor TX5 212-5.

In some embodiments, the floating diffusion FD 213 having an intrinsic capacitor (FDC) 219 is coupled to a reset transistor (RST) 214, a source follower (SF) transistor 220, a row select (RS) transistor 221, and a bitline BL (218), as described herein.

In some embodiments, pixel circuit 230 further includes a subsequent transfer transistor (TX5) 212-5 coupled to the FD 213. In operation, a reading charge of each photodiode 211 of the first photodiode PD1 211-1, the second photodiode PD2 211-2, and the third photodiode PD3 211-3 may be read-out by the pixel circuit 230. Specifically, a reading charge of the first photodiode PD1 211-1 may be read-out by the pixel circuit 230 by transferring a charge from the first photodiode PD 211-1 to the first transfer gate TX1 212-1, the central transfer transistor TX4 212-4, the subsequent transfer transistor 212-5, and the floating diffusion FD 213. Similarly, a reading charge of the second photodiode PD2 211-2 may be read-out by pixel circuit 230 by transferring a charge from the second photodiode PD2 211-2 to the second transfer gate TX 212-2, the central transfer gate TX4 212-4, the subsequent transfer gate 212-5, and the floating diffusion FD 213. Further, a reading charge of the third photodiode PD2 211-3 may be read-out by pixel circuit 230 by transferring a charge from the third photodiode PD2 211-3 to the third transfer gate TX 212-3, the central transfer gate TX4 212-4, the subsequent transfer gate 212-5, and the floating diffusion FD 213. In some embodiments, the accumulated charge may be transferred from the first photodiode PD1 211-1, the second photodiode PD2 211-2, and the third photodiode PD3 211-3 simultaneously, to achieve a gray image.

FIGS. 6A-6E are process diagrams of electrical charge propagation in accordance with an embodiment of the present disclosure. FIGS. 6A-6E represent cross-sections along line AA to AA' as shown in FIG. 4. Specifically, line AA to AA' represents a cross section of photodiode 211-B in the third quadrant Q3 of pixel 210 of FIG. 4. Cross section AA to AA' cuts through the photodiode 211-B through the first transfer transistor TX1 212-1, to the central transfer transistor TX4 212-4, through the subsequent transfer transistor TX5 212-5, and to the floating diffusion FD 213. On the left-hand side of each of FIGS. 6A-6E is the voltage in volts. As illustrated in FIGS. 6A-6E, the photodiode may include an insulator, and a plurality of gates (transistors TX1, TX4, TX5) above the insulator. Electrons e⁻ flow between the photodiode and the respective transistors in FIGS. 6A-6E.

Figures 6A, 6B, 6C, 6D, 6E:
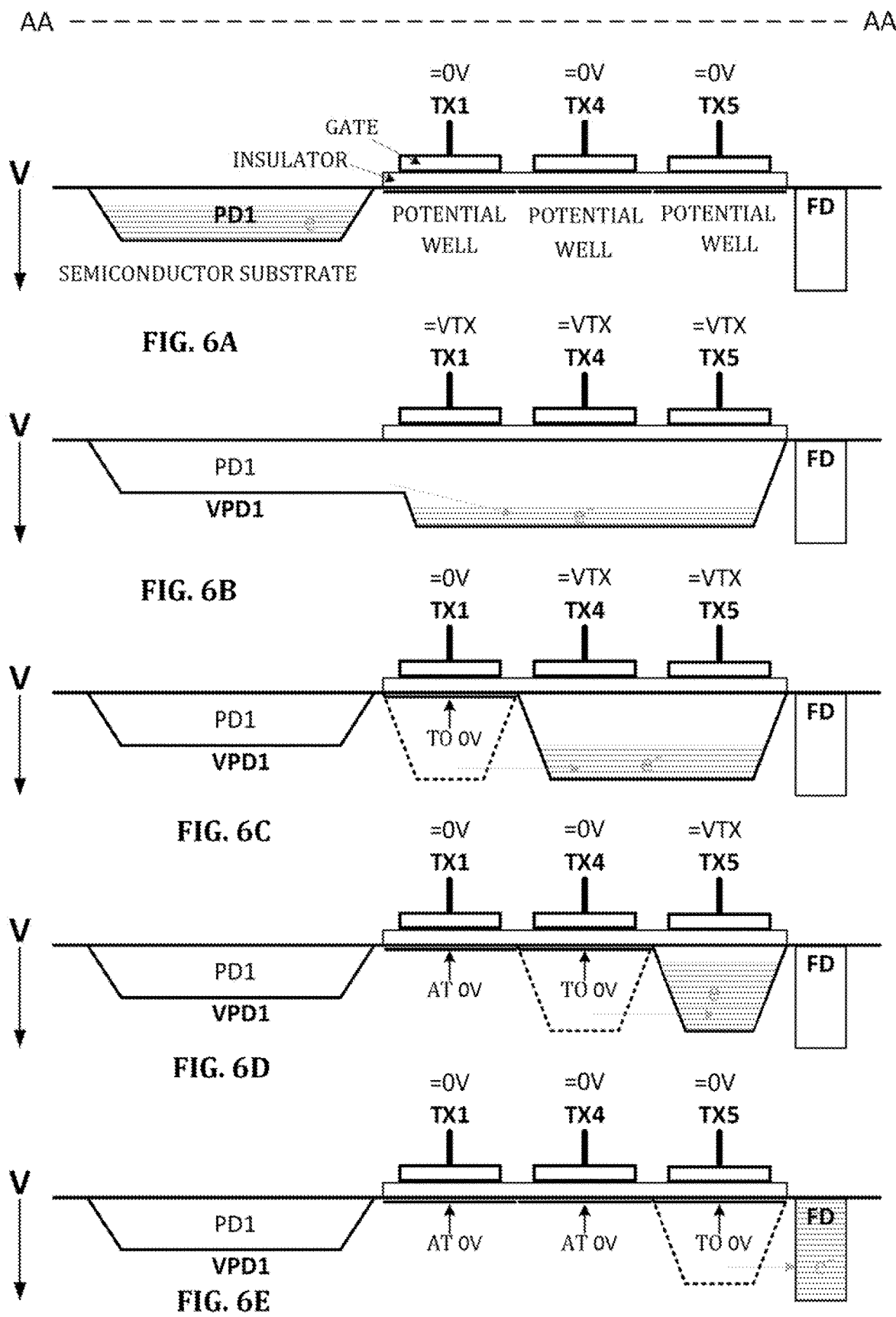
FIGS. 6A-6E are process diagrams of electrical charge propagation in accordance with an embodiment of the present disclosure.

As shown in FIG. 6A, photogenerated charge, in the form of electrons e⁻ is accumulated in the photodiode (PD1). The gate voltage of each transistor (first transfer transistor TX1, central transfer transistor TX4, and subsequent transfer transistor TX5) is at zero (0V), therefore setting an OFF state for each transistor. In FIG. 6B, the gates of transistors TX1, TX4 and TX5 are set to an ON state by the gate voltage VTX, therefore allowing the photogenerated charges to flow from the photodiode PD1 (211-B) into the wells of the first transfer transistor TX 212-1, the central transfer transistor TX4 212-4, and the subsequent transfer transistor TX5 212-5 and accumulates.

In FIG. 6C, after all electrons e⁻ finish their transfer, the gate of the first transfer transistor TX1 212-1 is set to an OFF position by setting the gate voltage back to 0V, and the charge has now flowed from the well of the first transfer transistor TX1 212-1 to the wells of the central transfer transistor 212-4 TX4 and the subsequent transfer transistor 212-5 TX5. The gates of the central transfer transistor TX4 212-4 and the subsequent transfer transistor are maintained at the voltage VTX, thus keeping these gates in their ON position. In FIG. 6D, the process of charge transfer continues. That is, after all electrons e' finish their transfer from the well of the central transfer transistor TX4 212-4, the gate of TX4 is set to the OFF position by setting the gate voltage back to 0V. At this point the charge accumulates at the subsequent transfer transistor TX5. The subsequent transfer transistor maintains gate voltage at VTX, thus maintaining this transistor in an ON state. In FIG. 6E, after all electrons e⁻ finish their transfers to floating diffusion FD, the subsequent transfer transistor TX5 212-5 gate is set to the OFF position by setting the gate voltage back to 0V. The charges are now accumulated in the floating diffusion FD 213. As explained with reference to FIG. 5, an RST transistor is coupled to a reference voltage AVDD and is configured to receive a reset control signal on its gate terminal. Therefore, the RST transistor may reset the floating diffusion FD 213. When TX1 212-1, TX2 212-2, TX3 212-3, TX4 212-4, and TX5 212-5 are all switched ON through their gate terminals, PD1, PD2, and PD3 are reset.

Figure 7:
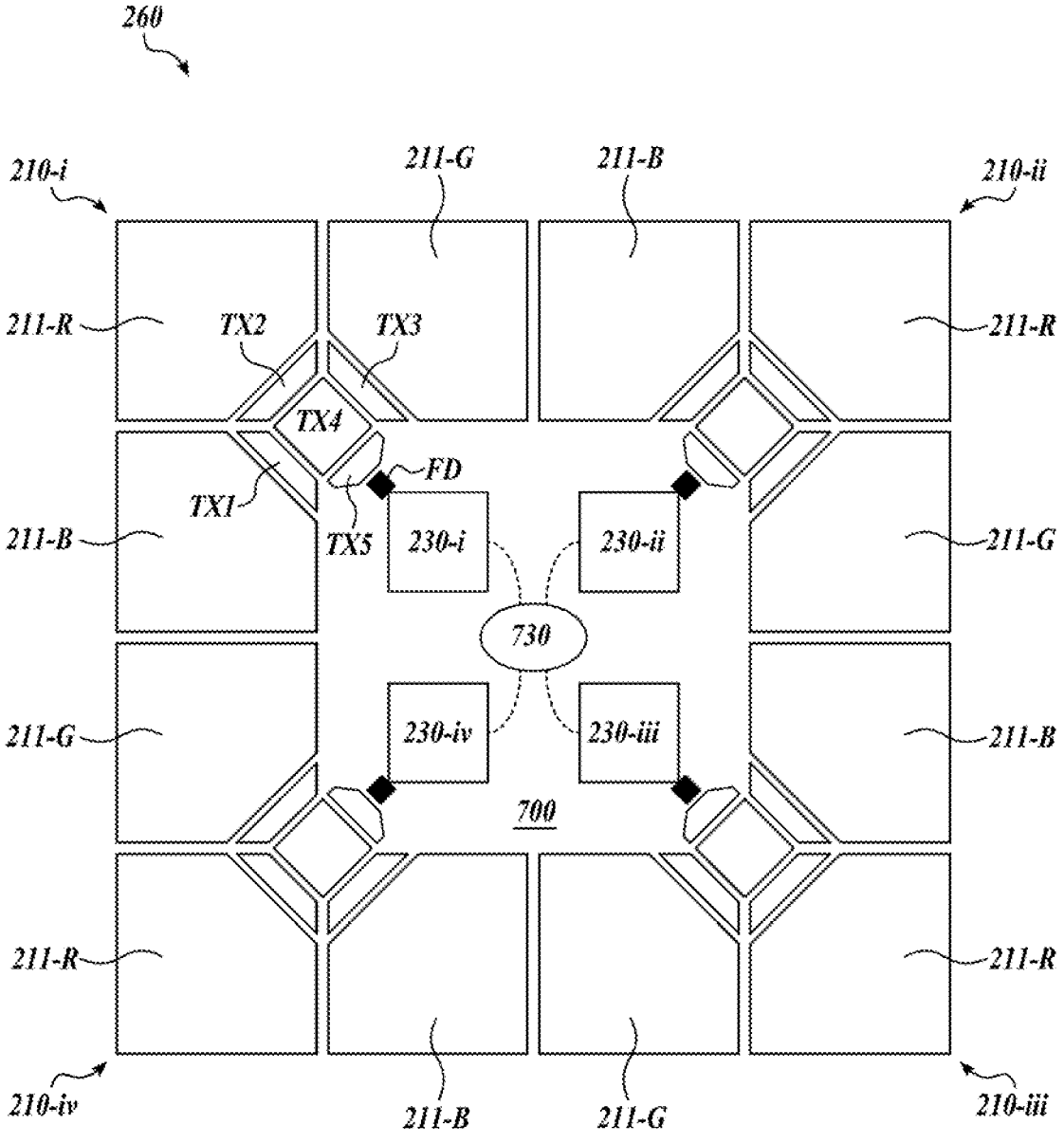
FIG. 7 is a top view of a pixel group in accordance with an embodiment of the present disclosure.

FIG. 7 is a top view of a group of pixels 260 in accordance with an embodiment of the present disclosure. In some embodiments, the plurality of pixels 103 of pixel array 102 of FIG. 1 is arranged to form a plurality of pixel groups, each pixel group 260 of the plurality of pixel groups including a first pixel 210-i, a second pixel 210-ii, a third pixel 210-iii, and a fourth pixel 210-iv. In some embodiments, each pixel group 260 of the plurality of pixel groups is arranged as a 2 by 2 array of pixels 210-i, 210-ii, 210-iii, 210-iv. In some embodiments, each pixel 210-i, 210-ii, 210-iii, 210-iv is structurally essentially identical to pixel 210 of FIG. 4. Accordingly, each pixel 210-i, 210-ii, 210-iii, 210-iv is understood to have a first quadrant, a second quadrant, a third quadrant, and a fourth quadrant (i.e., Q1, Q2, Q3, Q4), where a first photodiode 211-R, a second photodiode 211-G, and a third photodiode 211-B are located in the first quadrant, the second quadrant, and the third quadrant. For simplicity and to make FIG. 7 more readable, the readout circuits (pixel circuits) 230-i, 230-ii, 230-iii and 230-iv are illustrated symbolically with rectangles in this figure. A person of ordinary skill would understand that each pixel 210-i, 210-ii, 210-iii and 210-iv would require one readout circuit 230. Transfer transistors (such as 212-1 TX1, 212-2 TX2, 212-3 TX3 in FIG. 5) for each photodiode of the photodiodes 211-R, 211-B, 211-G, a central transfer transistor (such as TX4 212-4 in FIG. 5), a subsequent transfer transistor (such as TX5 212-5 in FIG. 5) and a floating diffusion FD (such as FD in FIG. 5) are marked for one pixel 210 only for simplicity and clarity of the drawings, but these transfer transistors are also present with other pixels and their readout circuits. In some embodiments, a color router (such as color router 303), covers all photodiodes 211 in the pixel group 260.

In some embodiments, each pixel 210-i, 210-ii, 210-iii, 210-iv in the pixel group 260 is arranged so that the fourth quadrant of each pixel is adjacent to the fourth quadrant of its adjacent pixels in the 2 by 2 pixel array. For example, the fourth quadrant of pixel 210-i is adjacent to the fourth quadrant of both pixel 210-ii and 210-iii. By arranging pixels 210-i, 210-ii, 210-iii, 210-iv in this manner, a connected pixel area 700 is formed. The connected pixel area 700 allows pixel circuitry 230-i, 230-ii, 230-iii, 230-iv to be located in the center of the pixel group 260. The connected pixel area 700 is configured to allow larger or common circuit components. For example, in some embodiments a large lateral overflow integration capacitor (LOFIC) 730 may be shared by all pixels in the group of pixels 260, as annotated by dash lines connecting each pixel 210-i, 210-ii, 210-iii and 210-iv to the LOFIC 730, and as described in more detail below. Such sharing of the LOFIC 730 may result in further savings in the real estate of the wafer that is occupied by the readout circuits. This allows for a greater utilization of space in the image sensor, and for the integration of larger circuit components. Furthermore, the presence of connected pixel area 700 may enable a placement of the pixels 210 and the pixel circuitry 230 in the same plane. A person of ordinary skill would know that the plane of the photodiodes of the pixels and the plane of the pixel circuitry are conventionally vertically offset, i.e., the photodiodes being above the circuitry when viewed from the side of source of light. Furthermore, in some embodiments, the connected pixel area 700 allows for the connected pixel circuit to include a larger source follower (SF) 220 to be located on a same horizontal plane as the photodiodes 211-R, 211-B, 211-G (e.g., a plane of paper in FIG. 7). A larger source follower SF may reduce noise of the image sensor.

Figure 8:
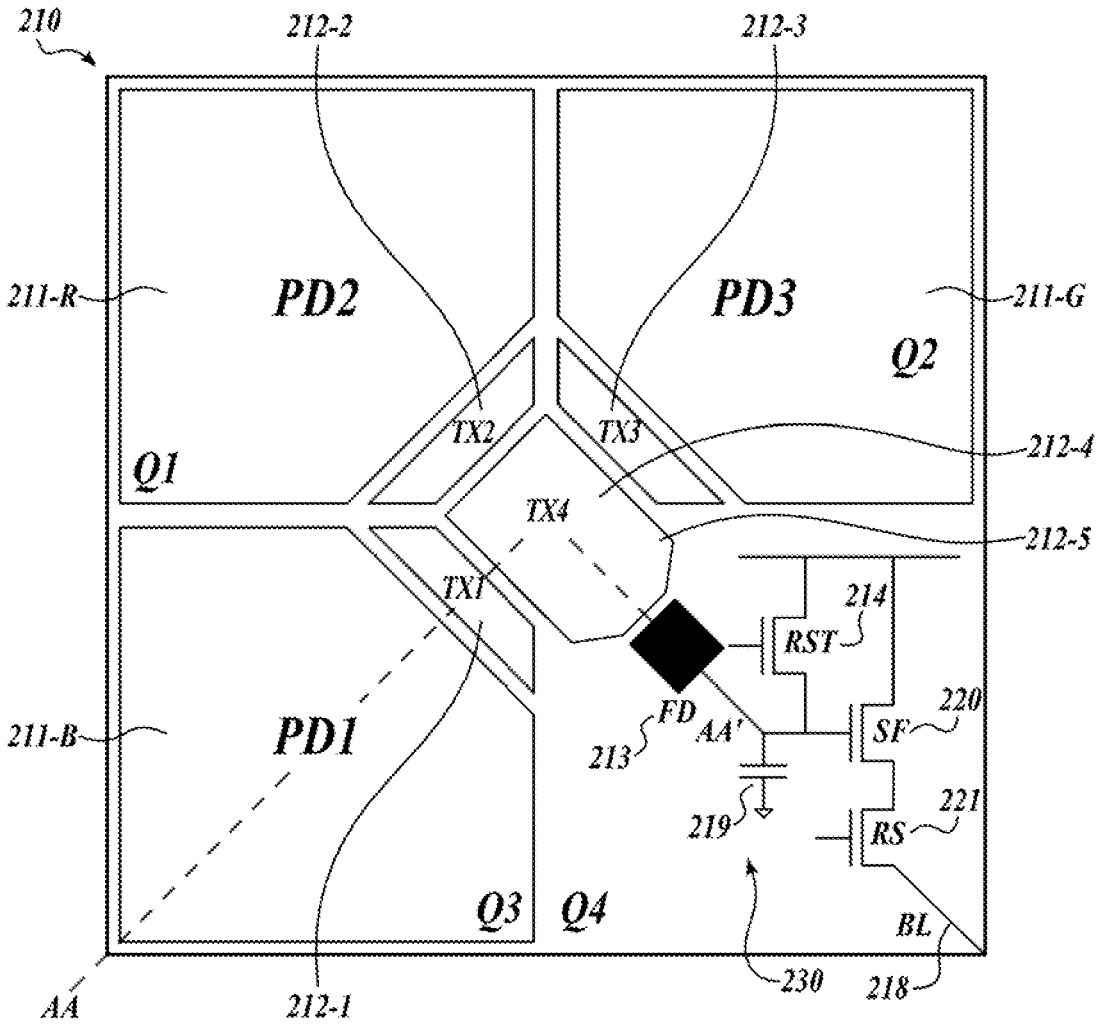
FIG. 8 is a top view of a group of photodiodes and pixel circuit in accordance with embodiments of the present disclosure.

FIG. 8 is a top view of a pixel 210 including a plurality of photodiodes 211-R, 211-B, 211-G and pixel circuit 230 in accordance with embodiments of the present disclosure. In some embodiments, the pixel 210 includes four quadrants Q1, Q2, Q3, and Q4. In some embodiments, the pixel includes a group of photodiodes 211-R, 211-G, 211-B. Each photodiode of the group of photodiodes 211-R, 211-G, 211-B is located in the first quadrant Q1, the second quadrant Q2, and the third quadrant Q3, respectively. In some embodiments, the pixel 210 includes only a single red photodiode 211-R, a single green photodiode 211-G, and a single blue photodiode 211-B. It should be understood that while the red photodiode 211-R is located in the first quadrant Q1, the green photodiode 211-G is located in the second quadrant Q2, and the blue photodiode 211-B is located in the third quadrant Q3 in FIG. 8, each photodiode of the group of photodiodes 211-R, 211-G, 211-B may be located in any quadrant Q1, Q2, and Q3. Accordingly, the overall structure is simpler. In some embodiments, the group of photodiodes 211-R, 211-G, 211-B may be the photodiodes 211-R, 211-G, 211-B shown in FIG. 3. The color router allows for the omission of conventional color filters and microlenses. The pixel circuitry 230 may be located on a same horizontal plane (e.g., the plane of paper in FIG. 8) as the photodiodes 211-R, 211-G, 211-B. This is in contrast with the layout of conventional photodiodes and pixel circuit where the photodiodes are distributed in one plane (or layer, closer to the color filters and microlenses) and the pixel circuits are distributed in another plane (further away from the filters and microlenses). In the conventional art, the plane of the photodiodes is configured between the plane of the pixel circuits on one side and the plane of the color filters and microlenses on the other side. Additionally, because the color router increases the efficiency of the group of photodiodes 211-R, 211-G, 211-B, only a single red photodiode 211-R, green photodiode 211-G, and blue photodiode 211-B may be included in the pixel 210 (as opposed to two green photodiodes 211-G included in a conventional pixel), thus generating an available space for a placement of the readout circuit (pixel circuit), as further explained below.

In some embodiments, the pixel 210 includes a central transfer transistor (TX4) 212-4. In some embodiments, each photodiode of the photodiodes 211-R, 211-G, 211-B includes a respective transfer transistor (TX1) 212-1, (TX2) 212-2, (TX3) 212-3. In some embodiments, the central transfer transistor TX4 212-4 is adjacent to transfer transistor TX1 212-1, transfer transistor TX2 212-2, transfer transistor TX3 212-3 of the first quadrant Q1, the second quadrant Q2, and the third quadrant Q3, respectively. In operation, each transfer transistor TX1 212-1, TX2 212-2, TX3 212-3 is enabled to transfer image charge from their respective photodiode 211-R, 211-G, 211-B to the central transfer transistor TX4 212-4, as described in detail in FIGS. 10A-10D.

In some equivalent embodiments, pixel circuit 230 includes a floating diffusion (FD) 213 that has an intrinsic capacitor (FDC) 219, a reset transistor (RST) 214, a source follower (SF) transistor 220, a row select (RS) transistor 221, and a bitline BL (218). In some embodiments, pixel circuit 230 does not include a subsequent transfer transistor (such as subsequent transfer transistor TX5 212-5 in FIG. 4). In such embodiments, the floating diffusion FD 213 is larger in size than the floating diffusion of FIG. 4. Accordingly, the larger floating diffusion FD 213 of FIG. 8 may have more capacitance than the smaller floating diffusion of FIG. 4. The increased size of the FD 213 is at least in part enabled by the absence of the subsequent transfer transistor TX5. The existence of the TX5 allows the FD 213 of FIG. 4 to further scale down to increase to a higher sensitivity with the least possible full well capacity. In some embodiments, it is desirable for the FD 213 to have a low capacitance, such that it enables a high conversion gain (HCG). In some embodiments, the pixel circuit (readout circuit) 230 allows for a readout from one photodiode of the group of photodiodes 212-R, 212-G, 212-B as shown and described in detail in FIG. 9.

In some embodiments, the pixel circuit 230 is configured to generate simultaneous readouts from the group of photodiodes 212-R, 212-B, 212-G to generate a black and white image. Dashed line AA to AA' represents a cross section of a flow path of charge from photodiode 211-B to the floating diffusion FD 213. This cross section is shown and further described with respect to FIGS. 10A-10D.

Figure 9:
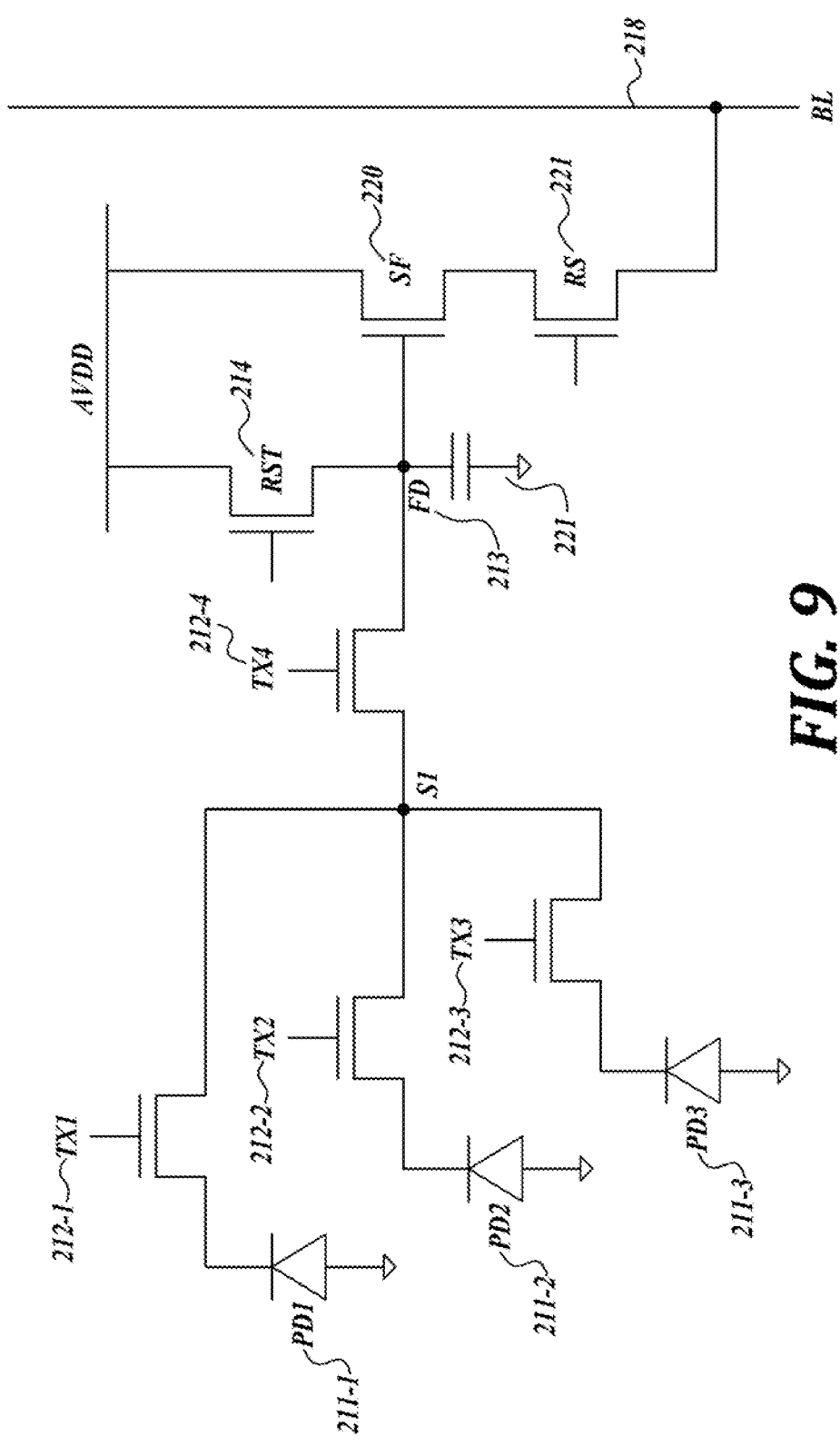
FIG. 9 is an illustrative schematic of a pixel circuit in accordance with an embodiment of the present disclosure.

FIG. 9 is an illustrative schematic of a pixel circuit in accordance with an embodiment of the present disclosure. Pixel circuit 230 is one possible architecture of pixel circuitry for implementing each pixel (such as pixel 210 in FIG. 8) within pixel array 103 of FIG. 1. Pixel circuit 230 can be implemented using front-side or back-side illuminated pixel arrays.

The illustrated embodiment of pixel circuit 230 includes a first photodiode (PD1) 211-1, a second photodiode (PD2) 211-2, and a third photodiode (PD3) 211-3. In some embodiments, the first photodiode PD1 211-1, the second photodiode PD2 211-2, and the third photodiode PD3 211-3 are coupled to a respective transfer transistor (TX1 212-1, TX2 212-2, TX3 212-3). Specifically, the first photodiode PD1 211-1 is coupled to a first transfer transistor TX1 212-1, the second photodiode PD2 211-2 is coupled to a second transfer transistor TX2 212-2, and the third photodiode PD3 is coupled to a third transfer transistor TX3 212-3. In one embodiment, the transfer transistors TX1 212-1, TX2 212-2, TX3 212-3 are sized similarly, which reduces space and increases the fill factor (defined as a ratio of an area occupied by different components of the readout circuit versus a total available area in the fourth quadrant Q4). In some embodiments, each of the transfer transistors 212-1, 212-2, 212-3 are coupled to node S1 which is coupled to a central transfer transistor TX4 212-4. In some embodiments, the central transfer transistor TX4 212-4 is further coupled to a floating diffusion FD 213. In some embodiments, the floating diffusion FD 213 is coupled to a capacitor (FDC) 219, a reset transistor (RST) 214, a source follower (SF) transistor 220, a row select (RS) transistor 221, and a bitline BL (218), as described herein.

In operation, a reading charge of each photodiode 211 of the first photodiode PD1 211-1, the second photodiode PD2 211-2, and the third photodiode PD3 211-3 may be readout by the pixel circuit 230. Specifically, a reading charge of the first photodiode PD1 211-1 may be readout by the pixel circuit 230 by transferring a charge from the first photodiode PD 211-1 to the first transfer transistor TX1 212-1, the central transfer transistor TX4 212-4, the subsequent transfer gate 212-5, and the floating diffusion FD 213. Similarly, a reading charge of the second photodiode PD2 211-2 may be readout by pixel circuit 230 by transferring a charge from the second photodiode PD2 211-2 to the second transfer transistor TX 212-2, the central transfer transistor TX4 212-4, and the floating diffusion FD 213. Further, a reading charge of the third photodiode PD2 211-3 may be readout by pixel circuit 230 by transferring a charge from the third photodiode PD2 211-3 to the third transfer transistor TX 212-3, the central transfer transistor TX4 212-4 and the floating diffusion FD 213. In some embodiments, charge may be transferred from the first photodiode PD1 211-1, the second photodiode PD2 211-2, and the third photodiode PD3 211-3 simultaneously, to achieve a black and white image.

FIGS. 10A-10D are process diagrams of electrical charge propagation in accordance with an embodiment of the present disclosure. FIGS. 10A-10D represent cross sections along line AA to AA' as shown in FIG. 8. Specifically, line AA to AA' represents a cross section of photodiode 211-B in the third quadrant Q3 of pixel 210 of FIG. 8. Cross section AA to AA' cuts through the photodiode 211-B through the first transfer transistor TX1 212-1, to the central transfer transistor TX4 212-4, and to the reset transistor (RST) 214. On the left-hand side of each of FIGS. 10A-10D is the voltage in volts. As illustrated in FIGS. 10A-10D, the photodiode may include an insulator, and a plurality of gates (transistors TX1, TX5) above the insulator. Electrons e⁻ flow between the photodiode and the respective transistors in FIGS. 10A-10D.

Figures 10A, 10B, 10C, 10D:
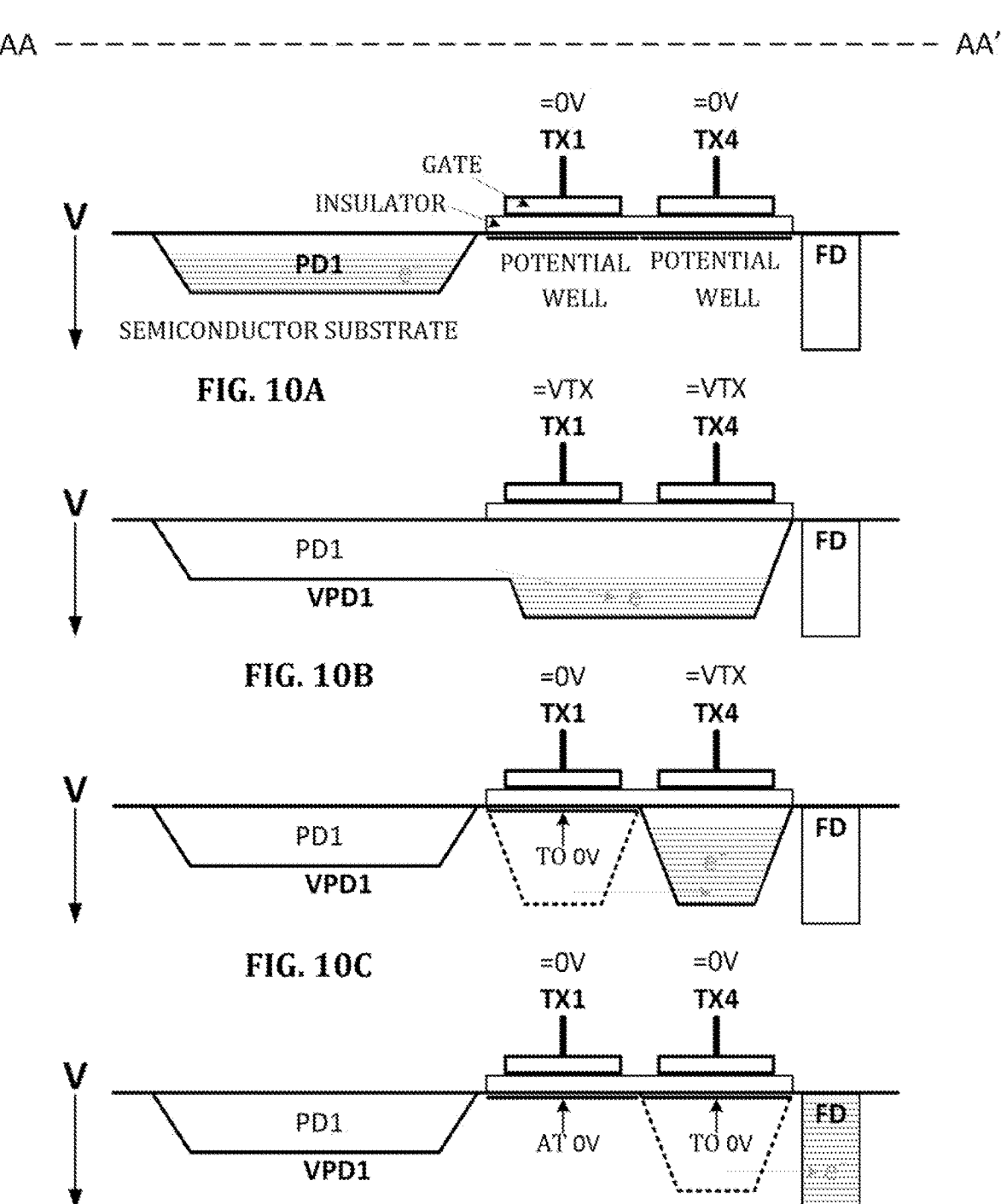
FIGS. 10A-10D are process diagrams of electrical charge propagation in accordance with an embodiment of the present disclosure.

As shown in FIG. 10A, photogenerated charge, in the form of electrons e⁻, is accumulated in the photodiode (PD1). The gate voltage of each transistor (first transfer transistor TX1 and central transfer transistor TX4) is at zero (0V), therefore setting an OFF state for each transistor. In FIG. 10B, the gates of transistors TX2, TX4 are set to an ON state by the gate voltage VTX, therefore allowing the photogenerated charges to flow from the photodiode PD1 (211-B) into the wells of the first transfer transistor TX 212-1 and the central transfer transistor TX 212-4 and accumulate.

In FIG. 10C, after all electrons e– finish their transfers, the first transfer transistor TX1 212-1 gate is set to an OFF position by setting the gate voltage back to 0V, and the photogenerated charge has now flowed from the well of TX1 212-1 to the well of the central transfer transistor TX4 212-4. The gates of the central transfer transistor 212-4 TX4 is maintained at the voltage VTX, thus keeping its gate in its ON position. In FIG. 10D, the process of the charge transfer continues. That is, after all electrons e– finish their transfers from the well of the central transfer transistor TX4 212-4, the gate of the central transfer transistor TX4 212-4 is set to an OFF position, by setting the gate voltage back to 0V. The charges are now accumulated in the floating diffusion 213. As explained with reference to FIG. 8, an RST transistor is coupled to a reference voltage AVDD and is configured to receive a reset control signal on its gate terminal. Therefore, the RST transistor may reset the floating diffusion FD 213. When TX1 212-1, TX2 212-2, TX3 212-3, and TX4 212-4 are all switched ON through their gate terminals, PD1, PD2, and PD3 are reset.

Figure 11:
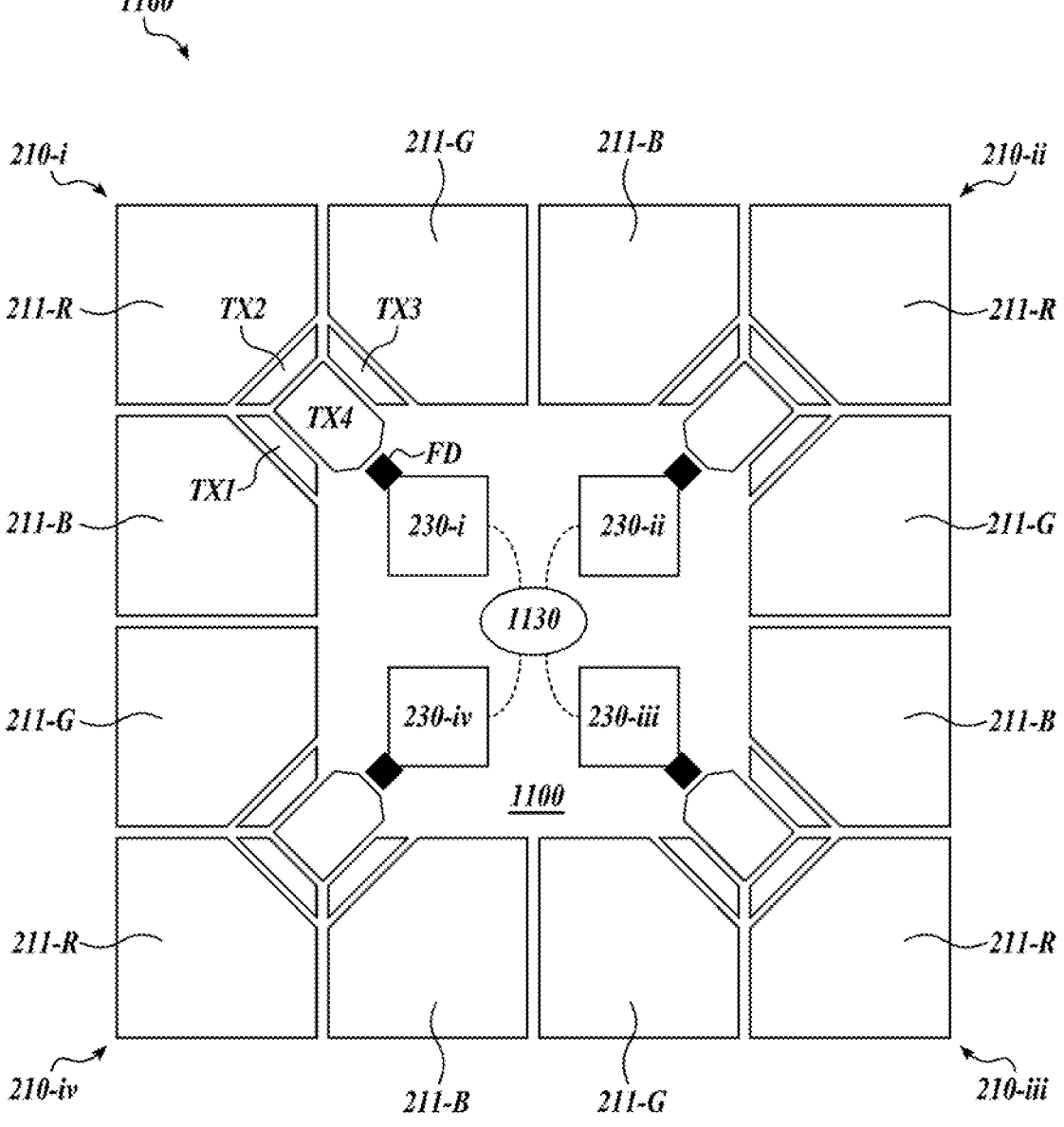
FIG. 11 is a top view of a pixel group in accordance with an embodiment of the present disclosure.

FIG. 11 is a top view of a group of pixels 1160 in accordance with an embodiment of the present disclosure. In some embodiments, the plurality of pixels 103 of pixel array 102 of FIG. 1 is arranged to form a plurality of pixel groups, each pixel group 1160 of the plurality of pixel groups comprising a first pixel 210-i, a second pixel 210-ii, a third pixel 210-iii, and a fourth pixel 210-iv. In some embodiments, each pixel group 1160 of the plurality of pixel groups is arranged in a 2 by 2 array. In some embodiments, each pixel 210-i, 210-ii, 210-iii, 210-iv is structurally essentially identical to pixel 210 of FIG. 8. Accordingly, each pixel 210-i, 210-ii, 210-iii, 210-iv is understood to have a first quadrant, a second quadrant, a third quadrant, and a fourth quadrant (i.e., Q1, Q2, Q3, Q4), where a first photodiode 211-R, a second photodiode 211-G, and a third photodiode 211-B are located in the first quadrant, the second quadrant, and the third quadrant, respectively. In some embodiments, a color router (such as color router 303), covers all photodiodes 211 in the pixel group 1160. For simplicity and to make FIG. 11 more readable, the readout circuits (pixel circuits) 230-i, 230-ii, 230-iii, and 230-iv are illustrated symbolically with rectangles in this figure. A person or ordinary skill would understand that each pixel 230-i, 230-ii, 230-iii, and 230-iv would require one readout circuit 230. Transfer transistors, (such as 212-1 TX1, 212-2 TX2, 212-3 TX3 in FIG. 8) for each photodiode of the photodiodes 211-R, 211-B, 211-G, a central transfer transistor (such as TX4 212-4 in FIG. 8), and a floating diffusion FD (such as FD 213 in FIG. 8) are marked for one pixel 210 only for simplicity and clarity of the drawings, but these transfer transistors are also present with other pixels and their readout circuits.

In some embodiments, each pixel 210-i, 210-ii, 210-iii, 210-iv in the pixel group 260 is arranged so that the fourth quadrant of each pixel is adjacent to the fourth quadrant of both adjacent pixels in the 2 by 2 pixel array. For example, the fourth quadrant of pixel 210-i is adjacent to the fourth quadrant of both pixel 210-ii and 210-iii. By arranging pixels 210-i, 210-ii, 210-iii, 210-iv in this manner, a connected pixel area 1100 is formed. The connected pixel area 1100 allows for pixel circuitry 230-i, 230-ii, 230-iii, 230-iv to be located in the center of the pixel group 1160. The connected pixel area 1100 is configured to allow larger circuit components of the pixel circuitry 230-i, 230-ii, 230-iii, 230-iv to share the space, and for shared pixel circuitry such as a lateral overflow integration capacitor (LOFIC) 1130, as described herein. For example, a large lateral overflow integration capacitor (LOFIC) may be shared by all pixels in the group of pixels 1160, as annotated by a dash line connecting each pixel 210-i, 210-ii, 210-iii and 210-iv to the LOFIC 1130, and as described in more detail below. Such sharing of the LOFIC 1130 may result in further savings in the real estate of the wafer being required for the readout circuits. In some embodiments, the connected pixel area 1100 allows for the pixel circuitry 230-i, 230-ii, 230-iii, 230-iv to include a large source follower (SF) to be located on a same horizontal plane as the photodiodes 211-R, 211-B, 211-G. A larger source follower SF may reduce noise of the image sensor.

Many embodiments of the technology described above may take the form of computer- or controller-executable instructions, including routines executed by a programmable computer or controller. Those skilled in the relevant art will appreciate that the technology can be practiced on computer/controller systems other than those shown and described above. The technology can be embodied in a special-purpose computer, application specific integrated circuit (ASIC), controller or data processor that is specifically programmed, configured or constructed to perform one or more of the computer-executable instructions described above. Of course, any logic or algorithm described herein can be implemented in software or hardware, or a combination of software and hardware.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
a plurality of pixels arranged in rows and columns of a pixel array disposed in a semiconductor substrate, wherein each pixel comprises a plurality of photodiodes;
a color router covering the plurality of photodiodes, wherein the plurality of pixels is configured to receive an incoming light through the color router;
a plurality of pixel circuits, wherein each pixel circuit is associated with a corresponding pixel of the plurality of pixels, wherein the plurality of pixel circuits are configured on a same horizontal plane as the plurality of photodiodes, wherein each pixel comprises a group of photodiodes, the group of photodiodes including only one of each of a blue photodiode, a red photodiode and a green photodiode, wherein each pixel comprises a first quadrant, a second quadrant, a third quadrant, and a fourth quadrant, wherein each photodiode of the group of photodiodes is configured in one of the first quadrant, the second quadrant, or the third quadrant of a pixel, and wherein a pixel circuit associated with the pixel is configured in the fourth quadrant of the pixel, and wherein the first quadrant, the second quadrant, and the third quadrant of the pixel each include a transfer transistor; and
a central transfer transistor, adjacent to each transfer transistor of the first quadrant, the second quadrant, and the third quadrant, wherein each transfer transistor of the first quadrant, the second quadrant, and the third quadrant are coupled to the central transfer transistor, and wherein each transfer transistor is configured to transfer charges from the respective photodiode of the first quadrant, the second quadrant, and the third quadrant to the central transfer transistor.

2. The image sensor of claim 1, wherein the pixel circuit includes at least the central transfer transistor, a floating diffusion, a reset transistor, a source follower transistor, and a row select transistor.

3. The image sensor of claim 2, wherein the pixel circuit further includes a subsequent transfer transistor coupled to the central transfer transistor and the floating diffusion.

4. The image sensor of claim 1, wherein the fourth quadrant further comprises a subsequent transfer transistor, coupled to the central transfer transistor, wherein the central transfer transistor is configured to transfer charge to the subsequent transfer transistor.

5. The image sensor of claim 4, wherein a floating diffusion is coupled to the subsequent transfer transistor and is configured to receive the charge from the subsequent transfer transistor.

6. The image sensor of claim 1, wherein the fourth quadrant further comprises a floating diffusion, coupled to the central transfer transistor and is configured to receive the charge from the central transfer transistor.

7. The image sensor of claim 1, wherein the plurality of pixels is arranged in a plurality of pixel groups, each pixel group of the plurality of pixel groups comprising a first pixel, a second pixel, a third pixel, and a fourth pixel, wherein each pixel group of the plurality of pixel groups is arranged in a 2 by 2 array, and wherein each pixel in the pixel group is arranged so that the fourth quadrant of each pixel is adjacent to the fourth quadrant of each adjacent pixel in the 2 by 2 array, forming a connected pixel area.

8. The image sensor of claim 7, wherein each pixel group of the connected pixel area comprises a connected pixel circuit that is associated with photodiodes of a given pixel.

9. The image sensor of claim 8, wherein each connected pixel circuit further comprises a lateral overflow integration capacitor (LOFIC).

10. The image sensor of claim 8, wherein each connected pixel circuit shares a common lateral overflow integration capacitor (LOFIC).

11. The image sensor of claim 1, wherein the central transfer transistor is located in a center region enclosed by the four quadrants on the same horizontal plane of the semiconductor substrate.

12. A method of reading readout charges of an image sensor, the image sensor comprising:
a plurality of pixels arranged in rows and columns of a pixel array disposed in a semiconductor substrate, wherein each pixel comprises a plurality of photodiodes,
a color router covering the plurality of photodiodes, wherein the plurality of pixels is configured to receive an incoming light through the color router, and
a plurality of pixel circuits, wherein each pixel circuit is associated with a corresponding pixel of the plurality of pixels, wherein the plurality of pixel circuits are configured on a same horizontal plane as the plurality of photodiodes, wherein each pixel comprises a group of photodiodes, the group of photodiodes including only one of each of a blue photodiode, a red photodiode and a green photodiode;
the method comprising:
transferring one or more charges from one or more photodiodes of the plurality of photodiodes to one or more transfer transistors of a plurality of transfer transistors, wherein each photodiode is coupled to a transfer transistor of the plurality of transfer transistors;
transferring the one or more charges from each respective transfer transistor to a central transfer transistor;
transferring the one or more charges to a floating diffusion;
reading out the one or more of charges to produce an image;
transferring charges from the red photodiode, the green photodiode, and the blue photodiode simultaneously; and
reading out the charges simultaneously to produce a black and white image.

13. The method of claim 12, wherein each pixel comprises a first quadrant, a second quadrant, a third quadrant, and a fourth quadrant, wherein each photodiode of the group of photodiodes is configured in one of the first quadrant, the second quadrant, or the third quadrant of a pixel, and wherein a pixel circuit associated with the pixel is configured in the fourth quadrant of the pixel.

14. The method of claim 13, wherein the pixel circuit includes at least a central transfer transistor, a floating diffusion, a reset transistor, a source follower transistor, and a row select transistor.

15. The method of claim 14, wherein the pixel circuit further includes a subsequent transfer transistor coupled to the central transfer transistor and the floating diffusion.

16. The method of claim 13, wherein the fourth quadrant further comprises a subsequent transfer transistor, coupled to the central transfer transistor, wherein the method further comprises:

transferring the one or more charges from the central transfer transistor to the subsequent transfer transistor before transferring the one or more charges to the floating diffusion.

17. The image sensor of claim 13, wherein the fourth quadrant further comprises a floating diffusion, coupled to the central transfer transistor and is configured to receive the charge from the central transfer transistor.

18. The method of claim 12, wherein the plurality of pixels is arranged in a plurality of pixel groups, each pixel group of the plurality of pixel groups comprising a first pixel, a second pixel, a third pixel, and a fourth pixel, wherein each pixel group of the plurality of pixel groups is arranged in a 2 by 2 array, and wherein each pixel in the pixel group is arranged so that the fourth quadrant of each pixel is adjacent to the fourth quadrant of each adjacent pixel in the 2 by 2 array, forming a connected pixel area.

19. The method of claim 18, wherein each pixel of the connected pixel area comprises a connected pixel circuit that is associated with photodiodes of a given pixel.

20. The method of claim 19, wherein each connected pixel circuit further comprises a lateral overflow integration capacitor (LOFIC).

21. The method of claim 19, wherein each connected pixel circuit shares a common lateral overflow integration capacitor (LOFIC).

22. The method of claim 13, wherein the image circuit further comprises the central transfer transistor located in a center region enclosed by the four quadrants on the same horizontal plane of the semiconductor substrate.

* * * * *